(12) United States Patent
Sjolin

(10) Patent No.: US 9,903,890 B1
(45) Date of Patent: Feb. 27, 2018

(54) METHOD AND SYSTEM FOR ESTIMATING THE RELATIVE GAIN AND OFFSET OF A CONVERTER

(71) Applicant: Prismatic Sensors AB, Stockholm (SE)

(72) Inventor: Martin Sjolin, Stockholm (SE)

(73) Assignee: PRISMATIC SENSORS AB, Stockholm (SE)

( * ) Notice: Subject to any disclaimer, the term of this patent is extended or adjusted under 35 U.S.C. 154(b) by 29 days.

(21) Appl. No.: 15/430,825

(22) Filed: Feb. 13, 2017

Related U.S. Application Data

(63) Continuation of application No. PCT/SE2016/050818, filed on Aug. 31, 2016.

(51) Int. Cl.
*G01R 17/00* (2006.01)
*G01T 1/18* (2006.01)

(52) U.S. Cl.
CPC .............. *G01R 17/00* (2013.01); *G01T 1/18* (2013.01)

(58) Field of Classification Search
CPC .......................... G01R 17/00; G01R 31/2614
USPC .......................................................... 702/64
See application file for complete search history.

(56) References Cited

U.S. PATENT DOCUMENTS

| 4,070,707 A | | 1/1978 | Barber | |
|---|---|---|---|---|
| 5,843,388 A | * | 12/1998 | Arroyo | A61L 2/26 206/369 |
| 8,585,286 B2 | | 11/2013 | Livne et al. | |
| 2004/0017224 A1 | * | 1/2004 | Tumer | H03F 3/087 327/51 |
| 2008/0265169 A1 | * | 10/2008 | Spartiotis | G01T 1/17 250/370.09 |

FOREIGN PATENT DOCUMENTS

EP    2650700 A1    10/2013

OTHER PUBLICATIONS

Ding et al., Characterization of energy response for photon-counting detectors using x-ray fluorescence, Nov. 11, 2014, Published online Nov. 11, 2014. doi: 10.1118/1.4900820, pp. 1-17.*

(Continued)

*Primary Examiner* — Mohamed Charioui
(74) *Attorney, Agent, or Firm* — Young & Thompson

(57) ABSTRACT

Disclosed are methods, systems, apparatuses and computer programs for estimating a measure of the gain and offset of a converter that generates, based on digital settings, reference voltages to be used as thresholds by a comparator in a photon-counting detector in an x-ray imaging system. Steps include selecting a first converter as a reference converter and a second converter as a target converter; assigning different digital settings to the reference converter to generate at least two different reference voltages to be used as thresholds by a comparator associated with the reference converter; and obtaining, based on photon count measurements, the number of photons registered in a photon counter associated with a comparator whose reference voltage is generated by the target converter. Based on the number of photons and the at least two digital settings, an estimate of the gain and offset of the target converter relative the reference converter results.

14 Claims, 9 Drawing Sheets

(56) References Cited

OTHER PUBLICATIONS

Xu, C. et al., "Evaluation of a Second-Generation Ultra-Fast Energy-Resolved ASIC for Photon-Counting Spectral CT," IEEE Transactions on Nuclear Science, vol. 60, No. 1, Feb. 2013, pp. 437-445.

Schlomka, J.P. et al., Experimental Feasibility of Multi-Energy Photon-Counting K-Edge Imaging in Pre-Clinical Computed Tomography, Phys. Med. Biol., 53, 2008, pp. 4031-4047.

Taguchi, K. et al., "Modeling the Performance of a Photon Counting X-Ray Detector for CT: Energy Response and Pulse Pileup Effects," Med. Phys. 38, 2, Feb. 2011, pp. 1089-1102.

Schioppa, Jr., E. et al., "Construction and Test of an X-Ray CT Setup for Material Resolved 3D Imaging with Medipix Based Detectors," 14th International Workshop on Radiation Imaging Detectors, 2012, pp. 1-6.

Liu, X. et al., "Energy Calibration of a Silicon-Strip Detector for Photon-Counting Spectral CT by Direct Usage of the X-Ray Tube Spectrum," IEEE Transactions on Nuclear Science, vol. 62, No. 1, Feb. 2015, pp. 68-75.

Panta, R. K. et al., "Energy Calibration of the Pixels of Spectral X-Ray Detectors," IEEE Transactions on Medical Imaging, vol. 34, No. 3, Mar. 2015, pp. 697-706.

May 8, 2017, International Search Report issued for related International Application No. PCT/SE2016/050818.

C. D. Arvanitis, et al., Empirical electro-optical and x-ray performance evaluation of CMOS active pixels sensor for low dose, high resolution x-ray medical imaging, Medical Physics, Dec. 2007, pp. 4612-4625, vol. 34, No. 12.

\* cited by examiner

METHOD AND SYSTEM FOR ESTIMATING THE RELATIVE GAIN AND OFFSET OF A CONVERTER

TECHNICAL FIELD

The proposed technology generally relates to methods, systems, apparatuses and computer programs for estimating the gain and offset of a converter for generating, based on digital settings, reference voltages to be used as thresholds by a comparator in a photon-counting detector in an x-ray imaging system.

BACKGROUND

Radiographic imaging such as x-ray imaging has been used for years in medical applications and for non-destructive testing.

Generally, an x-ray imaging system includes an x-ray source and an x-ray detector array consisting of multiple detectors comprising one or many detector elements, i.e. independent means of measuring x-ray intensity/fluence. The x-ray source emits x-rays, which pass through a subject or object to be imaged and are then registered by the detector array. Since some materials absorb a larger fraction of the x-rays than 25 others, an image is formed of the subject or object.

X-ray detectors with photon counting and energy resolving capabilities are becoming common for medical x-ray applications. Generally, a photon counting x-ray detector determines the energy of a photon by comparing the height of the electric pulse 30 generated by a photon interaction in the detector material to a set of comparator voltages. These comparator voltages are also referred to as energy thresholds. Generally, the analog voltage in a comparator is set by a digital-to-analog converter, DAC. The DAC converts a digital setting sent by a controller to an analog voltage with respect to which the heights of the photon pulses can be compared. In order to determine the energy of the photon, it is necessary to know the translation between the digital settings sent to the DAC and the photon energy. This relationship can be expressed as: $E=g \times DS+m$, where E is the energy of the photon, DS is the digital setting, g is referred to as the gain and m is referred to as the offset.

Determining the gain and the offset of the energy thresholds on a photon-counting detector is essential for avoiding artifacts in the reconstructed image. The avoided artifacts include ring artifacts, which arise when channels count a different number of x-rays even though the input x-ray spectrum is identical, due to the different positions of the energy thresholds. Ring artifacts can be mitigated by estimating the gain and the offset for each threshold on all channels and position the energy thresholds on the same position in keV. If the thresholds are on equal position in keV then identical input gives identical output for the different channels.

Also, un-calibrated energy thresholds can introduce a bias in when performing material basis decomposition, making it difficult to perform quantitative material decomposition, i.e. estimating the amount of a certain material in a certain pixel in the reconstructed image.

Further, the position of the lowest threshold, in keV, has a large impact on the overall detection efficiency of the detector. The detected spectrum has large content for low keV and placing the lowest threshold lower implies that more photons can be counted. However, each channel has electronic noise and placing a threshold too low can result in that a channel counts a lot of noise counts. Counting noise 25 degrades the signal and if too much noise is included, the signal cannot be used. Therefore, there is a trade-off in the position of the lowest threshold between including noise and including more real photons and by obtaining accurate values of the gain and the offset one can position the lowest threshold at the optimal position, which can increase the detection efficiency by several percent.

There are several known ways to estimate the gain and offset of a converter acting to create thresholds to a comparator. The most common is to use a mono-energetic x-ray source or a synchrotron x-ray beam and perform a scan of the digital setting to locate the position of the peak in the detected x-ray spectrum, see Refs. [1], [2], [3]. Other methods include performing a scan of the digital setting and identifying a feature in the detected spectrum, see Refs. [4] [5], fitting a model to the detected data [6] or varying the kilovoltage peak, kVp, of an x-ray tube and identifying the highest digital setting value for which counts are registered [7]. Common for all methods in the previous art is that they aim to calibrate all converters on a channel individually.

Even though several methods have been proposed to improve the estimation of the gain and offset of a converter there remains a need within the field to provide mechanisms that further improve the estimation of the gain and offset of a converter in order to obtain an efficient and reliable image reconstruction during e.g. x-ray imaging.

SUMMARY

It is a general object of the proposed technology to provide mechanisms that enable an estimation of a measure of the relative gain and offset of a converter that acts to generate thresholds for a comparator in a photon-counting detector in an x-ray imaging system.

It is a particular object of the proposed technology to provide a method that estimates the relative gain and offset of a converter.

It is another object to provide a system that is configured to estimate the relative gain and offset of a converter.

Yet another object is to provide a computer program for estimating the relative gain and offset of a converter.

It is a further object to provide an apparatus for estimating the relative gain and offset of a converter.

Still another object is to provide a method for estimating the relative gain and offset between two different converters in an x-ray imaging system.

These and other objects are met by embodiments of the proposed technology.

According to a first aspect, there is provided a method for estimating a measure of the gain and offset of a converter for generating, based on digital settings, reference voltages to be used as thresholds by a comparator in a photon-counting detector in an x-ray imaging system, the photon-counting detector comprising a plurality of comparators where the thresholds of an individual comparator is generated by a corresponding converter. The method comprises the steps of selecting, from the plurality of converters a first converter to act as a reference converter and a second converter to act as a target converter. The method also comprises the step of assigning at least two different digital settings, DS, to the reference converter, where the at least two digital settings, DS, are used to generate at least two different reference voltages, R, to be used as thresholds by a comparator associated with the reference converter 100. The method also comprises the step of obtaining, based on photon count measurements performed by the photon-counting detector when the target converter is assigned target digital settings, TDS, corresponding to target reference voltages, T, in the vicinity of the reference voltages, information representing the number of photons registered in a photon counter associated with a comparator whose reference voltage is generated by the target converter. The method also comprises the step of determining, based on the obtained information representing the number of photons and the at least two digital settings, DS, assigned to the reference converter, an estimate of the gain and offset of the target converter relative the reference converter.

According to a second aspect there is provided a system configured to estimate a measure of the gain and offset of a converter for generating, based on digital settings, reference voltages to be used as thresholds by a comparator in a photon-counting detector in an x-ray imaging system, said photon-counting detector comprising a plurality of comparators where the thresholds of an individual comparator is generated by a corresponding converter. The system is configured to select, from the plurality of converters a first converter to act as a reference converter and a second converter to act as a target converter. The system is also configured to assign at least two different digital settings, DS, to the reference converter, the at least two digital settings, DS, being used to generate at least two different reference voltages, R, to be used as thresholds by a comparator associated with the reference converter. The system is also configured to obtain, based on photon count measurements performed by the photon-count detector when the target converter is assigned target digital settings, TDS, corresponding to target reference voltages, T, distributed in the vicinity of the reference voltages, R, information representing the number of photons registered in a photon counter associated with a comparator whose reference voltage is generated by the target converter. The system 1 is also configured to determine, based on the obtained information representing the number of photons and said at least two digital settings, DS, assigned to the reference converter, an estimate of the gain and offset of the target converter relative the reference converter.

According to a third aspect, there is provided a computer program comprising instructions, which when executed by at least one processor, cause the at least one processor to:
  read information about at least two different digital settings, DS, assigned to a reference converter, the at least two digital settings, DS being used to generate at least two different reference voltages, R, to be used as thresholds by a comparator associated with the reference converter
  read information obtained through photon count measurements performed by a photon-counting detector when a target converter has been assigned target digital settings, TDS, corresponding to target reference voltages, T, in the vicinity of the reference voltages, information representing the number of photons registered in a photon counter associated with a comparator whose reference voltage is generated by the target converter, and
  determine, based on the read information representing the number of photons and the read information about said at least two digital settings, DS assigned to the reference converter, an estimate of the gain and offset of the target converter relative the reference converter.

Embodiments of the proposed technology make it possible to perform a relative calibration of the energy thresholds of a photon-counting and energy resolving detector. The method has a high degree of accuracy. Also, the method is fast and does not require a model of the imaging system. Also, the method does not require any identifiable feature in the x-ray spectrum. The source can consist of any broad spectrum x-ray generator. Also, if the noise floor of the detector is used as a source, i.e. the counts are generated if the thresholds are set below the noise floor, then the method can be used to determine the offset of the energy thresholds also without using an x-ray source.

Other advantages will be appreciated when reading the detailed description.

BRIEF DESCRIPTION OF THE DRAWINGS

The embodiments, together with further objects and advantages thereof, may best be understood by making reference to the following description taken together with the accompanying drawings, in which.

DETAILED DESCRIPTION

Throughout the drawings, the same reference designations are used for similar or corresponding elements.

For a better understanding of the proposed technology, it may be useful to begin with a brief system overview and/or analysis of the technical problem. To this end, reference is made to FIG. 1, which provides a schematic illustration of a photon-counting device according to prior art.

When a photon interacts in a semiconductor material, a cloud of electron-hole pairs is created. By applying an electric field over the detector material, the charge carriers are collected by electrodes attached to the detector material. The signal is routed from the detector elements to inputs of parallel processing circuits, e.g. ASICs. It should be understood that the term Application Specific Integrated Circuit, ASIC, is to be interpreted broadly as any general circuit used and configured for a specific application. The ASIC processes the electric charge generated from each x-ray and converts it to digital data, which can be used to obtain measurement data such as a photon count and/or estimated energy. In one example, the ASIC can process the electric charge such that a voltage pulse is produced with maximum height proportional to the amount of energy deposited by the photon in the detector material. The ASIC can comprise a set of comparators 302 where each comparator 302 compares the magnitude of the voltage pulse to a reference voltage. Digital-to-analog converters, DAC, 301 can be used to convert digital settings, which may be supplied by the user or a control program, to reference voltages that can be used by the comparators 302. If the height of the voltage pulse exceeds the reference voltage of a specific comparator, we will refer to the comparator as triggered. In a specific implementation, each comparator is numbered and associated with a digital counter 303. For each detected photon, the counter 303 associated to the comparator with the highest number among the triggered comparators is incremented. In this example implementation, it is intended that the magnitude of the reference voltages are ordered in the same way as the numbers, i.e. higher number corresponds to higher reference voltage, however, this is not a constraint and it is possible to set the reference voltages of all comparators independently. This feature is exploited by the disclosed invention.

Figure 1:
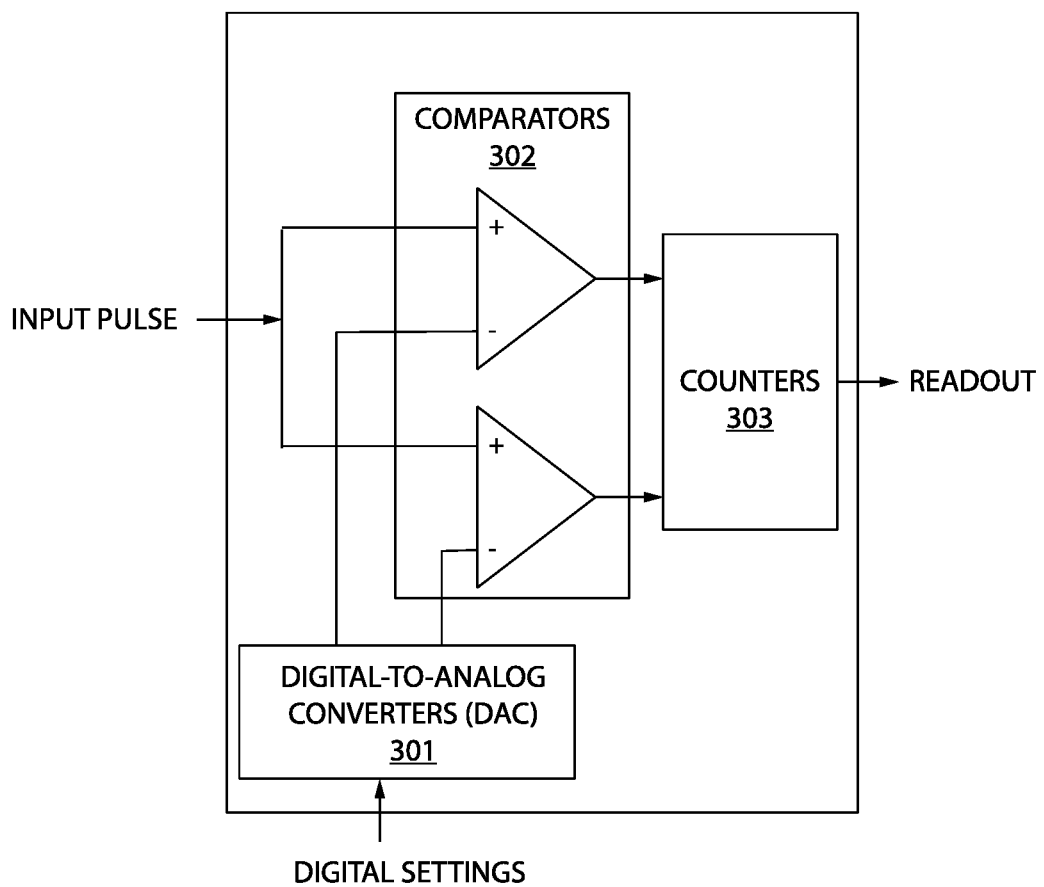
FIG. 1 is a schematic block diagram illustrating a photon counting device according to prior art.
Figure 9:
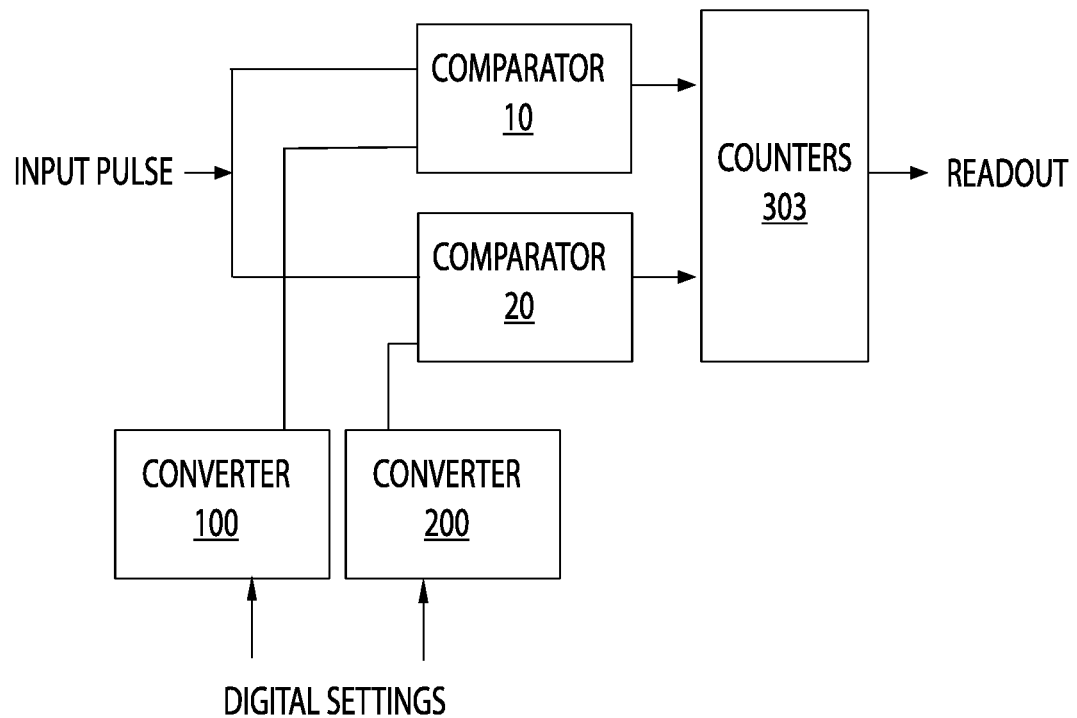
FIG. 9 is a block diagram illustrating parts of a photon counting device.

FIG. 9 provides a more detailed view of parts of a photon counting device. Here the group of comparators denoted 302 in FIG. 1 is schematically illustrated as comprising two different comparators 10; 20. To these comparators are associated corresponding converters 100 and 200. The converters, which might be digital-to-analog converters, DACs, other possibilities are however possible, were collectively denoted 301 in FIG. 1. The converters 100; 200 generate, based on provided digital settings, reference voltages to be used as thresholds by the corresponding comparators 10; 20. Hence during use of the photon counting device the comparators 10; 20 compares the value of an incoming pulse with the generated reference voltages and a photon is registered as a count based on the outcome of the comparison. In order to determine the energy of the detected photons, it is necessary to know the translation between the digital settings sent to the converter, e.g., the DAC, and the photon energy. This relationship can generally be expressed as: $E = g \times DS + m$, where E is the energy of the photon, DS is the digital setting, g is referred to as the gain and m is referred to as the offset. The disclosed invention relates to mechanisms for determining the relative gain and offset between different comparators on the same channel. The relative gain and offset relates the digital settings of two converters, for example:

$$DS1 = gDS2 + m,$$

where DS1 is the digital setting of a first converter, e.g. converter 100 and DS2 is the digital setting of a second converter, e.g. converter 200.

Figure 3:
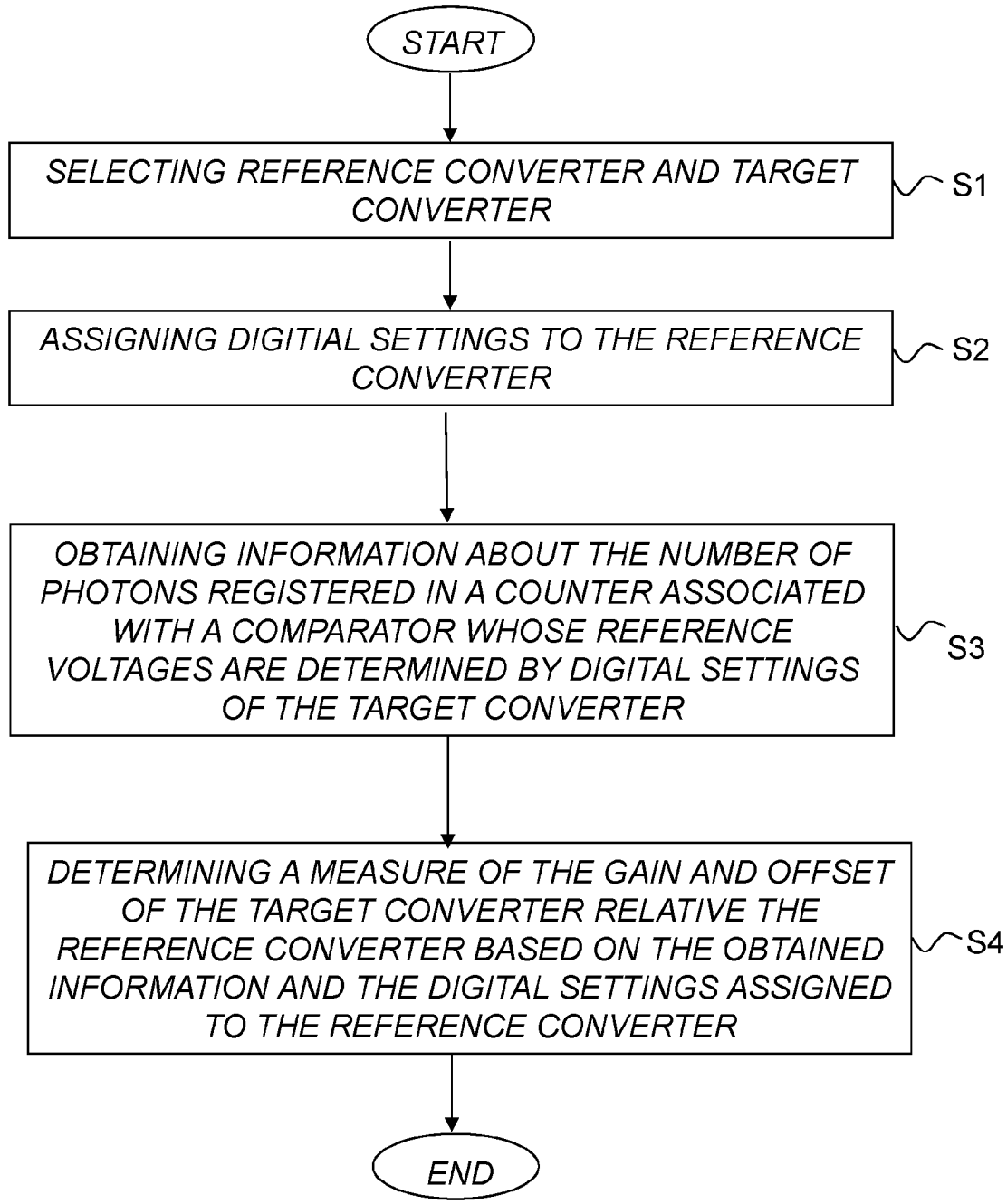
FIG. 3 is a schematic flow diagram illustrating a method for estimating a measure of the gain and offset according to the proposed technology.

FIG. 3 is a schematic flow diagram illustrating an example of a method for estimating a measure of the gain and offset of a converter 200 for generating, based on digital settings, reference voltages to be used as thresholds by a comparator 10, 20 in a photon-counting detector in an x-ray imaging system, the photon-counting detector comprising a plurality of comparators 10, 20 where the thresholds of an individual comparator 10, 20 is generated by a corresponding converter 100, 200. The method comprises the steps of selecting S1, from the plurality of converters 100, 200, a first converter to act as a reference converter 100 and a second converter to act as a target converter 200. The method also comprises the step of assigning S2 at least two different digital settings, DS, to the reference converter 100, the at least two digital settings, DS, being used to generate at least two different reference voltages, R, to be used as thresholds by a comparator associated with the reference converter 100. The method also comprises the step of obtaining S3, based on photon count measurements performed by the photon-counting detector when the target converter 200 is assigned target digital settings, TDS, corresponding to target reference voltages, T, in the vicinity of the reference voltages, information representing the number of photons registered in a photon counter associated with a comparator 20 whose reference voltage is generated by the target converter 200. The method also comprises the step of determining S4, based on the obtained information representing the number of photons and the at least two digital settings, DS, assigned to the reference converter, an estimate of the gain and offset of the target converter relative the reference converter.

Figure 8:
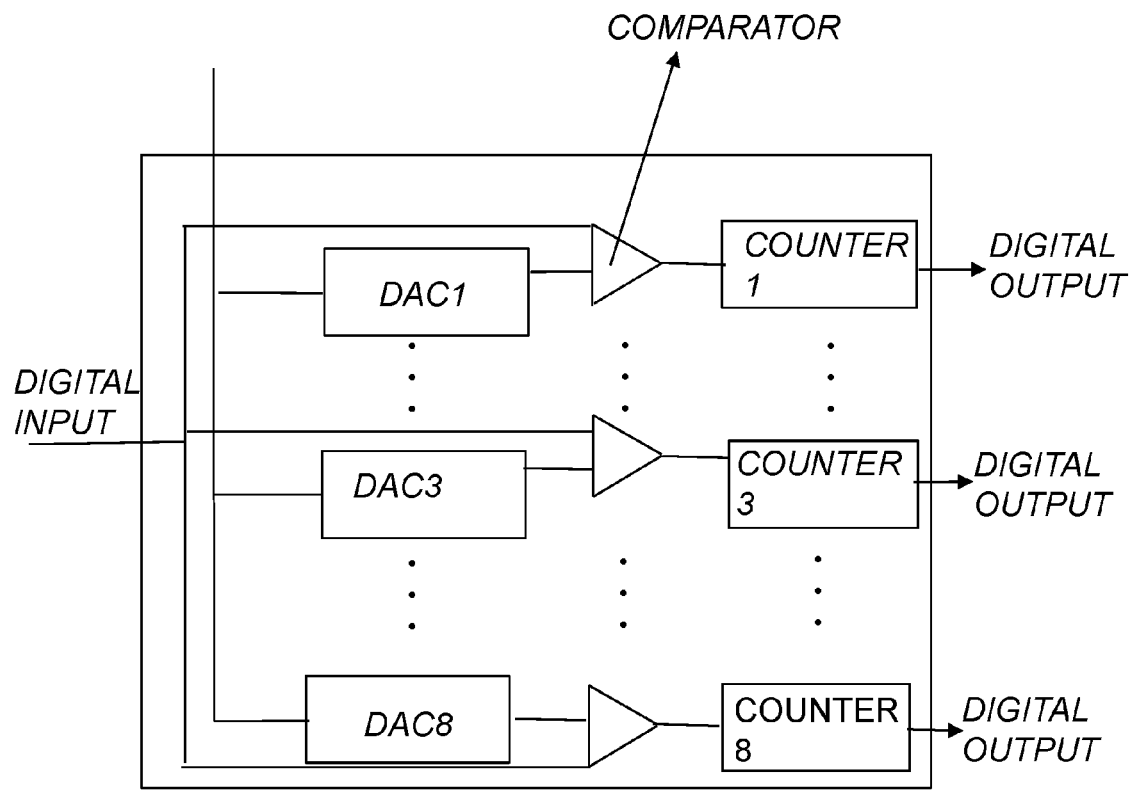
FIG. 8 is a block diagram illustrating parts of a photon counting device.

To illustrate the proposed method, consider the following simplified example of how the calibration procedure may be performed. Reference is made to FIG. 8 which illustrates the relevant parts of a photon-counting device. Shown is a number of converters, DAC1; DAC3; DAC8 and corresponding comparators. The converters are fed, or assigned, digital settings in order to generate reference voltages to be used by corresponding comparators. The comparators are in turn used for determining whether a photon should be registered by a particular counter. The outcome of the process may be output in digital form. According to the proposed method a particular converter among the number of converters, e.g. converter number 8, is selected in step S1 to act as the reference converter. Another particular converter is selected to act as the target converter, in this example is converter number 3 the target converter. The digital settings of the two converters have the following relation:

$$DS8 = gain*DS3 + offset$$

where DS8 and DS3 are the digital settings corresponding to converter number 8 and number 3, respectively. The proposed technology serves to determine a measure of the relative gain and offset between the two converters.

After having selected a reference converter and a target converter, a digital setting is assigned in step S2 to the reference converter DS8, e.g. the digital setting 55. A digital setting is also assigned to the target converter DS3. In step S3 one obtains information that represents the number of photons registered in a photon counter associated with a comparator whose reference voltage is generated by the target converter. The obtained information is based on a performed photon count measurement. The photon counts which register in the counter corresponding to the target converter are the photons with pulse height higher than the reference voltage of the target converter and lower than the reference voltage of the reference converter. Now, we determine the digital setting for which the two converters are equal by changing the digital setting of the target converter DS3 until we can identify a position in which the counter corresponding to the target converter registers essentially zero counts. Assume that we have identified that DS3=45 is the lowest digital setting for which the counter corresponding to the target converter gets zero or essentially zero counts. Then the procedure is repeated for a second digital setting of the reference converter DS8=100. Under the assumption that, DS3=95 gives zero or essentially zero counts in the counter corresponding to the target converter it will be possible to determine, in a step S4, an estimate of the gain and the offset by solving the following pair of equations:

$$55 = gain*45 + offset$$

$$100 = gain*95 + offset,$$

which is solved by gain=1 and offset=5. If the photon measurement for the second digital setting of the reference converter, DS8=100, instead would have shown that the counter corresponding to the target converter is zero or essentially zero for e.g. DS3=105. Then, the pair of equations would instead be:

$$55 = gain*45 + offset$$

$$100 = gain*105 + offset$$

which is solved by gain=0.83 and offset=12.5.

A particular embodiment of the proposed technology provides a method wherein the photon count measurements are performed with assigned target digital settings, TDS, chosen to generate target reference voltages, T, that are distributed around the at least two reference voltages, R, of the reference converter 100.

By way of example, the proposed technology provides a method wherein the assigned target digital settings, TDS, are chosen in order to generate target reference voltages, T, distributed both above and below each of the at least two reference voltages, R, of the reference converter 100.

According to another embodiment of the proposed technology there is provided a method wherein the step S3 of obtaining information comprises to obtain, for each of the at least two digital settings, R, assigned to the reference converter 100 and for each of the target digital settings, TDS, assigned to the target converter 200, information about the number of photons registered in a photon counter associated with a comparator 20 whose reference voltage is generated by a specific one of the assigned target digital settings, TDS.

A particular embodiment of the proposed technology provides a method wherein the step S3 of obtaining information comprises to obtain, for each of the at least two digital settings, R, assigned to the reference converter 100, a set of target digital settings, TDS, for which essentially no photon was registered in the photon counter.

Due to electronic noise, the energy E corresponding to a specific digital setting DS is not constant. This implies that counts can be registered by the target converter even if $E_t = E_r$ in mean since both $E_t$ and $E_r$ fluctuate slightly. Essentially no photons thus refers to a point when the registered counts are expected to come only from the fluctuation due to electronic noise and that the mean value of $E_t$ and $E_r$ are equal. Generally, this position can be found by linear regression, which was explained above and depicted in FIG. 2. This approach is accurate if the photon spectrum is approximately uniform in a region around the energy corresponding to the reference converter, where the uniform region should be at least two digital setting steps, DS steps, in order to perform a linear regression. In the case that the photon spectrum is non-uniform in the vicinity of the energy corresponding to the reference converter, non-linear fitting methods will have to replace the linear fitting method.

Still another particular embodiment of the proposed technology provides a method that further comprises selecting, for each value of the at least two digital settings, R, assigned to the reference converter 100, the lowest reference digital setting of the set of reference digital settings, and wherein the step of determining S4 an estimate of the gain and offset of the target converter 200 relative the reference converter 100 is based on each of the selected lowest reference digital setting and the at least two digital settings assigned to the reference converter 100.

The counter related to the target converter will count essentially zero counts for all values of $DS_t$ for which $E_t > E_r$. Therefore, in order to select the value of $DS_t$ for which $E_t = E_r$, it is preferable if one select the value of $DS_t$ that corresponds to the smallest value of $E_t$ among the values of $DS_t$ for which the counter associated to the target converter registers essentially zero counts.

Yet another embodiment of the proposed technology provides a method wherein the step S3 of obtaining information is based on two photon count measurements, a first photon count measurement performed with target digital settings chosen in order to generate target reference voltages, T, distributed in the vicinity of a first reference voltage of the at least two reference voltages, R, and a second photon count measurement performed with target digital settings chosen in order to generate target reference voltages, T, distributed in the vicinity of a second reference voltage of the at least two reference voltages, R. In this particular embodiment it is possible to determine, in step S4, an estimate of the gain, g, and offset, m, of the target converter 200 relative the reference converter 100 by solving the following equations for g and m:

$$DS_{r,1} = g \times DS_{t,1} + m \qquad \mathrm{i.}$$

$$DS_{r,2} = g \times DS_{t,2} + m, \qquad \mathrm{ii.}$$

where $DS_{r,1}$ is the highest of the digital settings assigned to the reference converter, $DS_{r,2}$ is the lowest of the digital settings assigned to the reference converter, $DS_{t,1}$ is the lowest reference digital setting for which no photon, or essentially no photon, was registered during a photon count measurement performed with target digital settings distributed in the vicinity of $DS_{r,1}$, and $DS_{t,2}$ is the lowest reference digital setting for which no photon, or essentially no photon, was registered during a photon count measurement performed with target digital settings distributed in the vicinity of $DS_{r,2}$.

To further illustrate the proposed embodiment, a highly simplified example is provided where the gain and offset, g and m, are determined by solving the linear system of equations. This can be done, for example, by:

$$DS_{r,2} = g \times DS_{t,2} + m => DS_{r,2} - g \times DS_{t,2} = m$$

$$DS_{r,1} = g \times DS_{t,1} + m => DS_{r,1} = g \times DS_{t,1} + DS_{r,2} - g \times DS_{r,2} =>$$

$$g = (DS_{r,1} - DS_{r,2})/(DS_{t,1} - DS_{t,2})$$

and $$m = DS_{r,2} - g \times DS_{r,2} = DS_{r,2} - (DS_{r,1} - DS_{r,2})/(DS_{t,1} - DS_{t,2}) \times DS_{t,2}.$$

Having described a number of embodiments of the proposed method in detail, below follows a particular example intended to illustrate the use of the proposed method in a scenario where there is an x-ray detector with N comparators. In order to know the energy intervals in which each of the counters register x-rays, one needs to know the gain and offset for all N comparators. The gain and offset for the comparators can be expressed: $E = g_i \times DS_i + m_i$, where E is the photon energy and i is the comparator number. The disclosed invention provides a method for determining the relative gain and offset between a target comparator and a reference comparator. The relative gain and offset relates the digital settings for the two comparators when the comparators are set at voltages corresponding to the same energy. If the energy corresponding to the target converter $E_t$ and the reference converter $E_r$ are the same, i.e:

$$g_r \times DS_r + m_r = E_r$$

$$g_t \times DS_t + m_t = E_t$$

$$E_t = E_r,$$

where subscript t refers to the target converter and subscript r refers to the reference converter, then $$g_r \times DS_r + m_r = g_t \times DS_t + m_t =>$$

$$DS_r = (g_t/g_r) \times DS_t + (m_t - m_r)/g_r =>$$

$$DS_r = g_{t,r} \times DS_t + m_{t,r}.$$

The relative gain and offset are defined as $g_{t,r} = g_t/g_r$ and $m_{t,r} = (m_t - m_r)/g_r$.

The values of the relative gain and offset, $g_{t,r}$ and $m_{t,r}$, can thus be determined by linear regression if we know the value of $DS_t$ and $DS_r$ for which $E_t = E_r = E^*$ for at least two different values of $E^*$.

Under the assumption that we have assigned the reference converter a digital setting $DS_r$ and we want to know the digital setting $DS_t$ for which $E_t = E_r$. We use the feature that for each detected photon, the counter associated to the comparator with the highest number among the triggered comparators is incremented. Assume that the reference converter has the higher number, then the counter associated with the target converter will count all x-rays with energy $E_t < E < E_r$. If $E_t < E_r$, there will be counts registered in counter associated with the target converter. However, if $E_t > E_r$, the target converter will ideally not register any counts. Therefore, one can find the digital setting of the target converter, $DS_t$, for which $E_t = E_r$ by finding the minimum $DS_t$ for which the counter associated to the target converter registers zero photons.

Due to the non-ideal energy resolution of all x-ray detectors, the target converter will count a few photons even when $E_t = E_r$. In order to perform a more accurate estimation of the position where $E_t = E_r$, we can use that the number of photons registered in the counter associated to the target converter will be approximately proportional to the difference between the energies associated with the target converter and the reference converter provided that the input spectrum is approximately constant, which is often true if the energy difference between the two converters is small. This implies that if we perform measurements for a set of values of the digital setting for the target converter $DS_t$, the number of registered photons will be approximately linearly decreasing as $E_t$ approaches $E_r$. By performing linear regression on the counter values associated to the target converter, the value of $DS_t$ for which the number of detected counts should be zero can be estimated.

Figure 2:
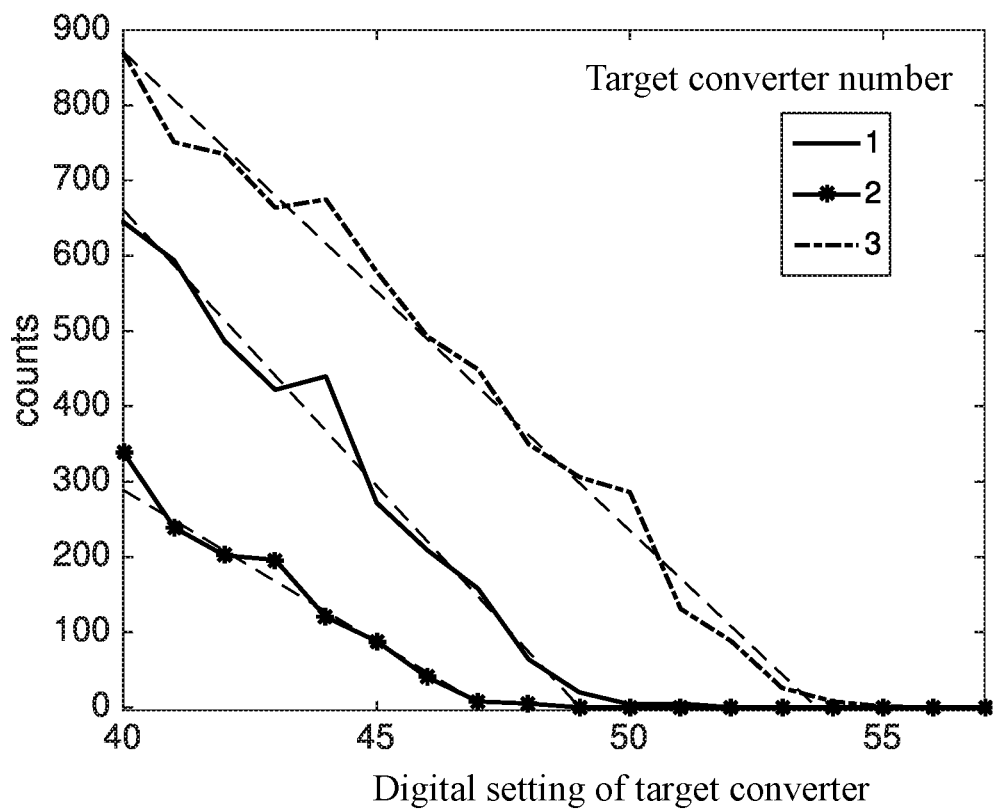
FIG. 2 is a graph illustrating the digital settings of the target converter plotted against the photon counts for three different target converter numbers.

FIG. 2 provides an illustration of the registered counts in the counters corresponding to three different comparators, comparator number 1, 2 and 3, for different values of $DS_t$. In this example, the reference comparator was number 8 and $DS_r$ was set 50. From the illustration, we can see that the values of $DS_t$ when $E_t = E_r$ is approximately 49, 47 and 54 for comparators number 1, 2 and 3 respectively.

The method according to the proposed technology may also be used to determine the relative gain and offsets between two converters that are not used as reference converter. Hence, if the gains and the offsets relative to the reference threshold have been determined for two different converters, a first converter and a second converter then the relative gain and offset between the first converter and the second converter can be determined.

The above mentioned can be achieved by means of a method according to what has previously been described, wherein the method is repeated for two different converters, a first target converter and a second target converter, in order to determine an estimate of the gain and offset of each of the target converters relative the reference converter, and wherein the method further comprises to determine the gain and offset of the first target converter relative the second target converter based on the determined estimate of the gain and offset of each of the target converters.

By way of example, the proposed technology provides a method wherein the gain and offset of the first target converter relative the second target converter is determined by solving the following equations:

$$S^1 = g_1 V^1_1 + m_1 \qquad \text{iii.}$$

$$S^1 = g_2 V^2_2 + m_2, \qquad \text{iv.}$$

where:

$S^1$ is a particular digital setting of the at least two digital settings assigned to the reference converter, $g_1$ and $m_1$ are the gain and offset, respectively, of the first target converter relative the reference converter, $V^1_1$ is the lowest reference digital setting of the first target converter for which no photon was registered during a photon count measurement performed with target digital settings distributed in the vicinity of $S^1$, $g_2$ and $m_2$, are the gain and offset, respectively, of the second target converter relative the reference converter, $V^2_2$ is the lowest reference digital setting of the second target converter for which no photon was registered during a photon count measurement performed with target digital settings distributed in the vicinity of $S^1$.

To illustrate the proposed method, consider the simplified example in which we have determined the gain and offset of a first converter, numbered 1, and a second converter, numbered 2, with respect to a reference converter. The relations between the digital settings, DS, for the different two target converters, numbered 1 and 2, and the reference converter, specified by subscript r, are then:

$$DS_r = g_{1,r} \times DS_1 + m_{1,r}$$

$$DS_r = g_{2,r} \times DS_2 + m_{2,r}$$

These relations can be used to relate the digital settings of the two target converters by:

$$g_{1,r} \times DS_1 + m_{1,r} = g_{2,r} \times DS_2 + m_{2,r} =>$$

$$(g_{1,r}/g_{2,r}) \times DS_1 + (m_{1,r} - m_{2,r})/g_{2,r} = DS_2 =>$$

$$g_{1,2} \times DS_1 + m_{1,2} = DS_2$$

where $g_{1,2} = (g_{1,r}/g_{2,r})$ and $m_{1,2} = (m_{1,r} - m_{2,r})/g_{2,r}$.

The proposed technology therefore provides a way to determine the relative gain and offset between two different converters.

The proposed technology is suitable for estimating the gain and offset of a particular converter, referred to as a target converter relative a reference converter wherein the converters are digital to analog converters DAC.

It will be appreciated that the methods and arrangements described herein can be implemented, combined and re-arranged in a variety of ways.

For example, embodiments may be implemented in hardware, or in software for execution by suitable processing circuitry, or a combination thereof.

The steps, functions, procedures, modules and/or blocks described herein may be implemented in hardware using any conventional technology, such as discrete circuit or integrated circuit technology, including both general-purpose electronic circuitry and application-specific circuitry.

Alternatively, or as a complement, at least some of the steps, functions, procedures, modules and/or blocks described herein may be implemented in software such as a computer program for execution by suitable processing circuitry such as one or more processors or processing units.

Examples of processing circuitry includes, but is not limited to, one or more microprocessors, one or more Digital Signal Processors (DSPs), one or more Central Processing Units (CPUs), video acceleration hardware, and/or any suitable programmable logic circuitry such as one or more Field Programmable Gate Arrays (FPGAs), or one or more Programmable Logic Controllers (PLCs).

It should also be understood that it may be possible to re-use the general processing capabilities of any conventional device or unit in which the proposed technology is implemented. It may also be possible to re-use existing software, e.g. by reprogramming of the existing software or by adding new software components.

The proposed technology also provides an arrangement or a system that is configured to perform the proposed methods. Such an arrangement or system may be configured to perform all the proposed method steps described earlier in this specification.

According to an aspect of the proposed technology there is thus provided a system suitable to implement the proposed method. It is therefore provided a system 1 configured to estimate a measure of the gain and offset of a converter 200 for generating, based on digital settings, reference voltages to be used as thresholds by a comparator 10, 20 in a photon-counting detector in an x-ray imaging system, said photon-counting detector comprising a plurality of comparators 10, 20 where the thresholds of an individual comparator 10, 20 is generated by a corresponding converter 100, 2001. The system 1 is configured to select, from the plurality of converters 100, 200, a first converter to act as a reference converter 100 and a second converter to act as a target converter 200. The system 1 is also configured to assign at least two different digital settings, DS, to the reference converter 100, the at least two digital settings, DS, being used to generate at least two different reference voltages, R, to be used as thresholds by a comparator associated with the reference converter 100. The system 1 is also configured to obtain, based on photon count measurements performed by the photon-counting detector when the target converter 200 is assigned target digital settings, TDS, corresponding to target reference voltages, T, distributed in the vicinity of the reference voltages, R, information representing the number of photons registered in a photon counter associated with a comparator 20 whose reference voltage is generated by the target converter 200. The system 1 is also configured to determine, based on the obtained information representing the number of photons and said at least two digital settings, DS, assigned to the reference converter, an estimate of the gain and offset of the target converter relative the reference converter.

Figure 4:
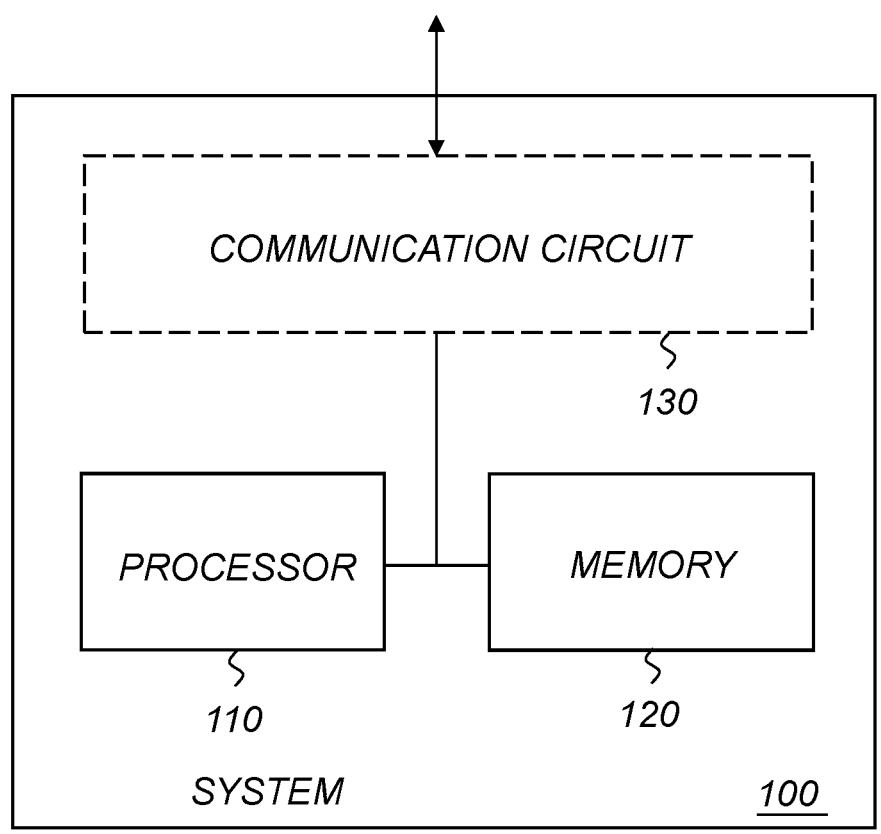
FIG. 4 is a schematic block diagram illustrating a particular system according to the proposed technology.

FIG. 4 is a schematic block diagram illustrating an example of a system 100, based on a processor-memory implementation according to an embodiment. In this particular example, the arrangement/system 100 comprises a processor 110 and a memory 120, the memory 120 comprising instructions executable by the processor 110, whereby the processor is operative to estimate a measure of the gain and offset of a converter for generating, based on digital settings, reference voltages to be used as thresholds by a comparator in a photon-counting detector in an x-ray imaging system.

Figure 5:
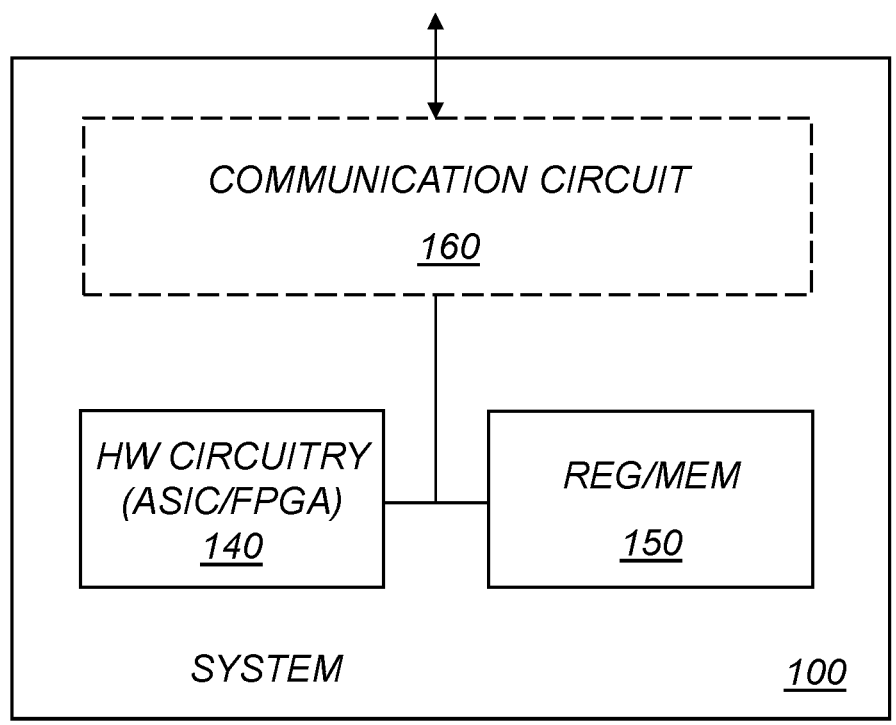
FIG. 5 is a schematic block diagram illustrating an alternative system according to the proposed technology.

FIG. 5 is a schematic block diagram illustrating another example of an arrangement or system 100, based on a hardware circuitry implementation according to an embodiment. Particular examples of suitable hardware circuitry 140 include one or more suitably configured or possibly reconfigurable electronic circuitry, e.g. Application Specific Integrated Circuits (ASICs), Field Programmable Gate Arrays (FPGAs), or any other hardware logic such as circuits based on discrete logic gates and/or flip-flops interconnected to perform specialized functions in connection with suitable registers (REG) and/or memory units (MEM) 150.

Figure 6:
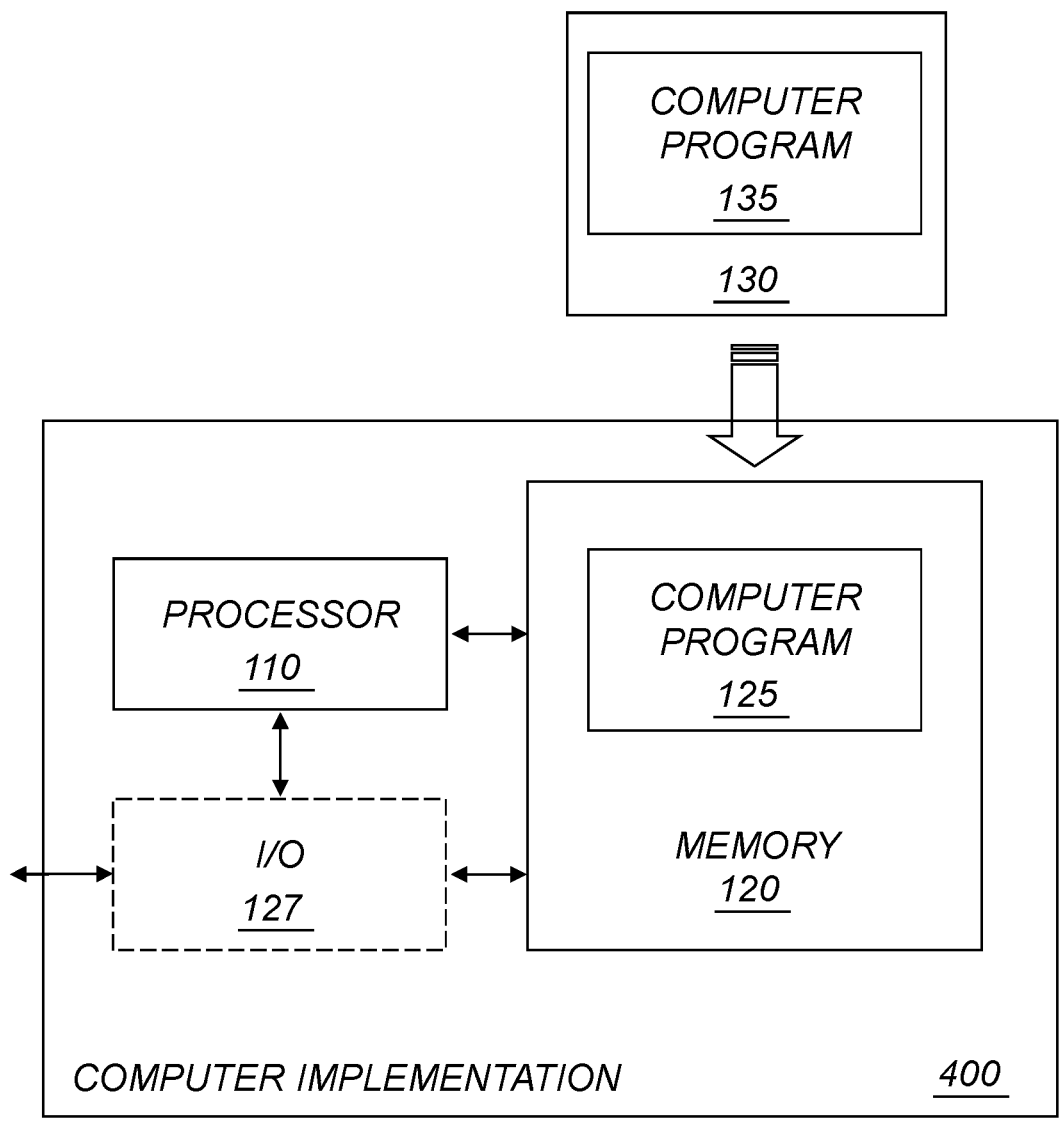
FIG. 6 is a block diagram illustrating how a computer program can be implemented in a system according to the proposed technology.

The embodiments of the systems illustrated in FIG. 5 and FIG. 6 may optionally be provided with a communication circuitry 130 for enabling the system to communicate with external apparatuses.

It is also possible to provide a solution based on a combination of hardware and software. The actual hardware-software partitioning can be decided by a system designer based on a number of factors including processing speed, cost of implementation and other requirements.

FIG. 6 is a schematic diagram illustrating an example of a computer-implementation according to an embodiment. In this particular example, at least some of the steps, functions, procedures, modules and/or blocks described herein are implemented in a computer program 125; 135, which is loaded into the memory 120 for execution by processing circuitry including one or more processors 110. The processor(s) 110 and memory 120 are interconnected to each other to enable normal software execution. An optional input/output device 127 may also be interconnected to the processor(s) 110 and/or the memory 120 to enable input and/or output of relevant data such as input parameter(s) and/or resulting output parameter(s).

The term 'processor' should be interpreted in a general sense as any system or device capable of executing program code or computer program instructions to perform a particular processing, determining or computing task.

The processing circuitry including one or more processors 110 is thus configured to perform, when executing the computer program 125, well-defined processing tasks such as those described herein.

The processing circuitry does not have to be dedicated to only execute the above-described steps, functions, procedure and/or blocks, but may also execute other tasks.

The proposed technology also provides a computer program 125; 135 comprising instructions, which when executed by at least one processor 110, cause the at least one processor 110 to:

read information about at least two different digital settings, DS, assigned to a reference converter 100, said at least two digital settings, DS, being used to generate at least two different reference voltages, R to be used as thresholds by a comparator associated with the reference converter 100 read information obtained through photon count measurements performed by a photon-counting detector when a target converter 200 has been assigned target digital settings, TDS, corresponding to target reference voltages, T, in the vicinity of said reference voltages, information representing the number of photons registered in a photon counter associated with a comparator 20 whose reference voltage is generated by the target converter 200; and determine, based on the read information representing the number of photons and the read information about said at least two digital settings, DS, assigned to the reference converter, an estimate of the gain and offset of the target converter relative the reference converter.

The proposed technology also provides a carrier comprising the computer program, wherein the carrier is one of an electronic signal, an optical signal, an electromagnetic signal, a magnetic signal, an electric signal, a radio signal, a microwave signal, or a computer-readable storage medium.

By way of example, the software or computer program 125; 135 may be realized as a computer program product, which is normally carried or stored on a computer-readable medium 120; 130, in particular a non-volatile medium. The computer-readable medium may include one or more removable or non-removable memory devices including, but not limited to a Read-Only Memory (ROM), a Random Access Memory (RAM), a Compact Disc (CD), a Digital Versatile Disc (DVD), a Blu-ray disc, a Universal Serial Bus (USB) memory, a Hard Disk Drive (HDD) storage device, a flash memory, a magnetic tape, or any other conventional memory device. The computer program may thus be loaded into the operating memory of a computer or equivalent processing device for execution by the processing circuitry thereof.

The flow diagram or diagrams presented herein may be regarded as a computer flow diagram or diagrams, when performed by one or more processors. A corresponding apparatus may be defined as a group of function modules, where each step performed by the processor corresponds to a function module. In this case, the function modules are implemented as a computer program running on the processor.

The computer program residing in memory may thus be organized as appropriate function modules configured to perform, when executed by the processor, at least part of the steps and/or tasks described herein.

Figure 7:
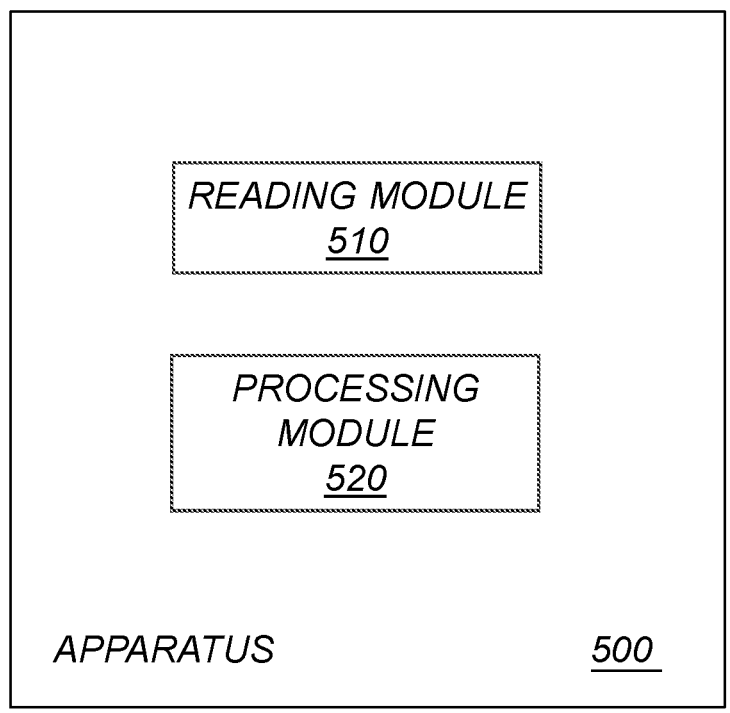
FIG. 7 is a block diagram illustrating an apparatus according to the proposed technology.

FIG. 7 is a schematic diagram illustrating an example of an apparatus 500 for estimating a measure of the gain and offset of a converter 200 for generating, based on digital settings, reference voltages to be used as thresholds by a comparator 10, 20 in a photon-counting detector in an x-ray imaging system, wherein the apparatus 500 comprises:
- a reading module 510 for reading information about at least two different digital settings, DS, assigned to a reference converter 100, said at least two digital settings, DS, being used to generate at least two different reference voltages, R to be used as thresholds by a comparator associated with the reference converter 100
- a reading module 510 for reading information obtained through photon count measurements performed by a photon-counting detector when a target converter 200 has been assigned target digital settings, TDS, corresponding to target reference voltages, T, in the vicinity of said reference voltages, information representing the number of photons registered in a photon counter associated with a comparator 20 whose reference voltage is generated by the target converter 200; and
- a processing module 520 for determining, based on the read information representing the number of photons and the read information about said at least two digital settings, DS, assigned to the reference converter, an estimate of the gain and offset of the target converter relative the reference converter.

Alternatively, it is possible to realize the module(s) in FIG. 7 predominantly by hardware modules, or alternatively by hardware, with suitable interconnections between relevant modules. Particular examples include one or more suitably configured digital signal processors and other known electronic circuits, e.g. discrete logic gates interconnected to perform a specialized function, and/or Application Specific Integrated Circuits (ASICs) as previously mentioned. Other examples of usable hardware include input/output (I/O) circuitry and/or circuitry for receiving and/or sending signals. The extent of software versus hardware is purely implementation selection.

The embodiments described above are merely given as examples, and it should be understood that the proposed technology is not limited thereto. It will be understood by those skilled in the art that various modifications, combinations and changes may be made to the embodiments without departing from the present scope as defined by the appended claims. In particular, different part solutions in the different embodiments can be combined in other configurations, where technically possible.

REFERENCES

[1] C. Xu, M. Persson, H. Chen, S. Karlsson, M. Danielsson, C. Svensson, and H. Bornefalk, "Evaluation of a second-generation ultra-fast energy resolved asic for photon-counting spectral ct," Nuclear Science, IEEE Transactions on, vol. 60, no. 1, pp. 437-445, 2013.

[2] J. Schlomka, E. Roessl, R. Dorscheid, S. Dill, G. Martens, T. Istel, C. Bäumer, C. Herrmann, R. Steadman, G. Zeitler et al., "Experimental feasibility of multi-energy photon-counting k-edge imaging in pre-clinical computed tomography," Physics in medicine and biology, vol. 53, no. 15, p. 4031, 2008.

[3] K. Taguchi, M. Zhang, E. C. Frey, X. Wang, J. S. Iwanczyk, E. Nygard, N. E. Hartsough, B. M. Tsui, and W. C. Barber, "Modeling the performance of a photon counting x-ray detector for ct: Energy response and pulse pileup effects," Medical physics, vol. 38, no. 2, pp. 1089-1102, 2011.

[4] A. Livne, N. Wainer, J.-P. Schlomka, E. Roessl, and R. Proksa, "Spectral detector calibration," Nov. 19 2013, U.S. Pat. No. 8,585,286.

[5] J. Uher, J. Visser et al., "Construction and test of an x-ray ct setup for material resolved 3d imaging with medipix based detectors," Journal of Instrumentation, vol. 7, no. 10, p. C10007, 2012.

[6] X. Liu, H. Chen, H. Bornefalk, M. Danielsson, S. Karlsson, M. Persson, C. Xu, and B. Huber, "Energy calibration of a silicon-strip detector for photon-counting spectral ct by direct usage of the x-ray tube spectrum," Nuclear Science, IEEE Transactions on, vol. 62, no. 1, pp. 68-75, 2015.

[7] R. K. Panta, M. F. Walsh, S. T. Bell, N. G. Anderson, A. P. Butler, and P. H. Butler, "Energy calibration of the pixels of spectral x-ray detectors," IEEE Trans. Med. Im. 34(3), pp. 697-706, 2015.

The invention claimed is:

1. A method for estimating a measure of the gain and offset of a converter for generating, based on digital settings, reference voltages to be used as thresholds by a comparator in a photon-counting detector in an x-ray imaging system, said photon-counting detector comprising a plurality of comparators where the thresholds of an individual comparator is generated by a corresponding converter, the method comprises the steps of:
  selecting, from the plurality of converters, a first converter to act as a reference converter and a second converter to act as a target converter;
  assigning at least two different digital settings to the reference converter, said at least two digital settings being used to generate at least two different reference voltages to be used as thresholds by a comparator associated with the reference converter;
  obtaining, based on photon count measurements performed by said photon-counting detector when the target converter is assigned target digital settings corresponding to target reference voltages around said reference voltages, information representing the number of photons registered in a photon counter associated with a comparator whose reference voltage is generated by the target converter; and determining, based on the obtained information representing the number of photons and said at least two digital settings assigned to the reference converter, an estimate of the gain and offset of the target converter relative the reference converter, wherein said target converter and said reference converter belong to comparators on a same channel.

2. The method according to claim 1, wherein said photon count measurements are performed with assigned target digital settings chosen to generate target reference voltages that are distributed around said at least two reference voltages of the reference converter.

3. The method according to claim 2, wherein the assigned target digital settings are chosen in order to generate target reference voltages distributed both above and below each of said at least two reference voltages of the reference converter.

4. The method according to claim 1, wherein the step of obtaining information comprises to obtain, for each of said at least two digital settings assigned to the reference converter and for each of said target digital settings assigned to the target converter, information about the number of photons registered in a photon counter associated with a comparator whose reference voltage is generated by a specific one of said assigned target digital settings.

5. The method according to claim 4, wherein the step of obtaining information comprises to obtain, for each of said at least two digital settings assigned to the reference converter, a set of target digital settings, for which essentially no photon were registered in said photon counter.

6. The method according to claim 5, wherein the method further comprises selecting, for each value of said at least two digital settings assigned to the reference converter, the lowest reference digital setting of said set of reference digital settings, and wherein the step of determining an estimate of the gain and offset of the target converter relative the reference converter is based on each of the selected lowest reference digital setting and said at least two digital settings assigned to the reference converter.

7. The method according to claim 1, wherein the step of obtaining information is based on two photon count measurements, a first photon count measurement performed with target digital settings chosen in order to generate target reference voltages distributed around a first reference voltage of said at least two reference voltages, and a second photon count measurement performed with target digital settings chosen in order to generate target reference voltages distributed around a second reference voltage of said at least two reference voltages.

8. The method according to claim 7, wherein the step of determining an estimate of the gain, g, and offset, m, of the target converter relative the reference converter comprises to solve the following equations for g and m:

$$S1=gV1+m \qquad \text{i.}$$

$$S2=gV2+m, \qquad \text{ii.}$$

where S1 is the highest of the digital settings assigned to the reference converter, S2 is the lowest of the digital settings assigned to the reference converter, V1 is the lowest reference digital setting for which no photon were registered during a photon count measurement performed with target digital settings distributed around S1, and V2 is the lowest reference digital setting for which no photon were registered during a photon count measurement performed with target digital settings distributed around S2.

9. The method according to claim 1, wherein the method is repeated for two different converters, a first target converter and a second target converter, in order to determine an estimate of the gain and offset of each of said first and second target converters relative the reference converter, and wherein the method further comprises to determine the gain and offset of the first target converter relative the second target converter based on the determined estimate of the gain and offset of each of the first and second target converters.

10. The method according to claim 9, wherein the gain and offset of the first target converter relative the second target converter is determined by solving the following equations:

$$S1=g1V11+m1 \qquad \text{i.}$$

$$S1=g2V22+m2, \qquad \text{ii.}$$

where:

S1 is a particular digital setting of said at least two digital settings assigned to the reference converter, g1 and m1 are the gain and offset, respectively, of said first target converter relative said reference converter, V11 is the lowest reference digital setting of the first target converter for which no photon were registered during a photon count measurement performed with target digital settings distributed around S1, g2 and m2, are the gain and offset, respectively, of said second target converter relative said reference converter, V22 is the lowest reference digital setting of the second target converter for which no photon were registered during a photon count measurement performed with target digital settings distributed around S1.

11. A method according to claim 1, wherein said converter is a digital to analog converter, DAC.

12. A system configured to estimate a measure of the gain and offset of a converter for generating, based on digital settings, reference voltages to be used as thresholds by a comparator in a photon-counting detector in an x-ray imaging system, said photon-counting detector comprising a plurality of comparators where the thresholds of an individual comparator is generated by a corresponding converter, wherein:

the system is configured to select, from the plurality of converters, a first converter to act as a reference converter and a second converter to act as a target converter;

the system is configured to assign at least two different digital settings to the reference converter, said at least two digital settings being used to generate at least two different reference voltages to be used as thresholds by a comparator associated with the reference converter;

the system is configured to obtain, based on photon count measurements performed by the photon-count detector when the target converter is assigned target digital settings corresponding to target reference voltages distributed around said reference voltages, information representing the number of photons registered in a photon counter associated with a comparator whose reference voltage is generated by the target converter; and the system is configured to determine, based on the obtained information representing the number of photons and said at least two digital settings assigned to the reference converter, an estimate of the gain and offset of the target converter relative the reference converter, wherein said target converter and said reference converter belong to comparators on a same channel.

13. A computer-program product comprising a non-transitory computer-readable medium having stored thereon a computer program comprising instructions, which when executed by at least one processor, cause the at least one processor to:

read information about at least two different digital settings assigned to a reference converter, said at least two digital settings being used to generate at least two different reference voltages to be used as thresholds by a comparator associated with the reference converter;

read information obtained through photon count measurements performed by photon-counting detector when a target converter has been assigned target digital settings corresponding to target reference voltages around said reference voltages, information representing the number of photons registered in a photon counter associated with a comparator whose reference voltage is generated by the target converter; and determine, based on the read information representing the number of photons and the read information about said at least two digital settings assigned to the reference converter, an estimate of the gain and offset of the target converter relative the reference converter, wherein said target converter and said reference converter belong to comparators on a same channel.

14. A method for estimating a measure of the gain and offset of a converter for generating, based on digital settings, reference voltages to be used as thresholds by a comparator in a photon-counting detector in an x-ray imaging system, said photon-counting detector comprising a plurality of comparators where the thresholds of an individual comparator is generated by a corresponding converter, the method comprises the steps of:

estimating, by the method according to claim 1, the gain and offset of two different target converters relative said reference converter; and determining, based on the estimated gains and offsets, the relative gain and offset between said two different target converters.

\* \* \* \* \*